United States Patent [19]

Bialas, Jr. et al.

[11] Patent Number: 4,547,682

[45] Date of Patent: Oct. 15, 1985

[54] PRECISION REGULATION, FREQUENCY MODULATED SUBSTRATE VOLTAGE GENERATOR

[75] Inventors: John S. Bialas, Jr., Manassas; Richard J. Daniels, Dumfries; William J. Mruk, Chantilly, all of Va.

[73] Assignee: International Business Machines Corporation, Armonk, N.Y.

[21] Appl. No.: 546,223

[22] Filed: Oct. 27, 1983

[51] Int. Cl.[4] .......................... H03B 5/24; H03L 7/04

[52] U.S. Cl. .................................... 307/297; 307/304

[58] Field of Search .................... 307/296 R, 297, 304

[56] References Cited

U.S. PATENT DOCUMENTS

| | | | |
|---|---|---|---|
| T954,006 | 1/1977 | Lee et al. | 331/57 X |
| 4,115,710 | 9/1978 | Lou | 307/297 X |
| 4,388,537 | 6/1983 | Kanuma | 307/297 |
| 4,390,798 | 6/1983 | Kurafuji | 307/297 X |
| 4,430,581 | 2/1984 | Mogi et al. | 307/296 R |
| 4,473,762 | 9/1984 | Iwahashi et al. | 307/443 X |

*Primary Examiner*—Stanley D. Miller

*Assistant Examiner*—D. R. Hudspeth

*Attorney, Agent, or Firm*—H. St. Julian; John E. Hoel

[57] ABSTRACT

A precision regulation substrate voltage generator circuit is disclosed which employs frequency modulation to modify the oscillator frequency driving the substrate charge pump, in order to more precisely control the resultant substrate voltage in an integrated circuit.

3 Claims, 5 Drawing Figures

SUBSTRATE GENERATOR WITH FEEDBACK TO OSCILLATOR

SUBSTRATE GENERATOR WITH FEEDBACK TO OSCILLATOR

PRECISION REGULATION, FREQUENCY MODULATED SUBSTRATE VOLTAGE GENERATOR

FIELD OF THE INVENTION

The invention disclosed broadly relates to integrated circuits and more particularly relates to substrate voltage generator circuits.

BACKGROUND OF THE INVENTION

The semiconductor substrate in large scale integrated circuit chips must be maintained at a predetermined voltage relative to the active portions of the circuit, in order to establish a suitable reference for the generation and processing of signals by the integrated circuit. The diffusion structures in the substrate are generally maintained in a reversed bias state and during normal operation they inject a small positive current into the substrate, known as the substrate load current or leakage load current. The large number of diffusion structures in a large scale integrated circuit chip substantially increases the magnitude of this load current.

Substrate voltage generator circuits are employed to pump negative charge back into the substrate of the integrated circuit chip in order to compensate for the substrate load current so as to maintain a suitable negative voltage bias on the substrate.

Existing substrate voltage generator circuits have difficulty in maintaining the substrate voltage within precise tolerances for large scale integrated circuit chips, especially when rapid changes in the substrate load current occur. A uniform and predefined substrate voltage generator value is essential to the proper operation of large scale integrated circuitry. Prior art substrate voltage generator circuits, for example as is described in U.S. Pat. No. 4,356,412, employ a feedback connection to control an oscillator which drives the charge pump of the circuit. The substrate voltage is controlled by gating the oscillator into either an on or off state in response to the voltage magnitude sensed on the substrate. This technique has typically resulted in less precise voltage tolerance in the resultant substrate voltage generated for large integrated circuit chips and has not provided a quick enough response to rapid changes which can occur in the substrate load current.

OBJECTS OF THE INVENTION

It is therefore an object of the invention to provide an improved substrate voltage generator circuit for large scale integrated circuit chips.

It is a further object of the invention to provide a more precise regulation of the substrate voltage produced by a substrate voltage generator circuit.

It is another object of this invention to provide a substrate voltage generator circuit which can quickly respond to rapid changes in the substrate load current.

SUMMARY OF THE INVENTION

These and other objects, features and advantages of the invention are accomplished by the precision regulation, frequency modulated substrate voltage generator circuit disclosed herein. The substrate voltage generator circuit invention employs frequency modulation to modify the oscillator frequency driving the substrate charge pump, in order to more precisely control the resultant substrate voltage in a large scale integrated circuit chip. A frequency modulated feedback mechanism provides the precise control of the substrate voltage, by controlling the frequency of the oscillator which drives the charge pump for the circuit. In addition, the invention provides an auxiliary source of substrate load current for increasing the responsiveness with which corrections to the substrate voltage can be made. This compound operation of the resulting circuit enables a very precise tolerance to be maintained on the resultant substrate voltage of the integrated circuit chip.

DESCRIPTION OF THE FIGURES

These and other objects, features and advantages of the invention will be more fully appreciated with reference to the accompanying figures.

DISCUSSION OF THE PREFERRED EMBODIMENT

Figure 1:
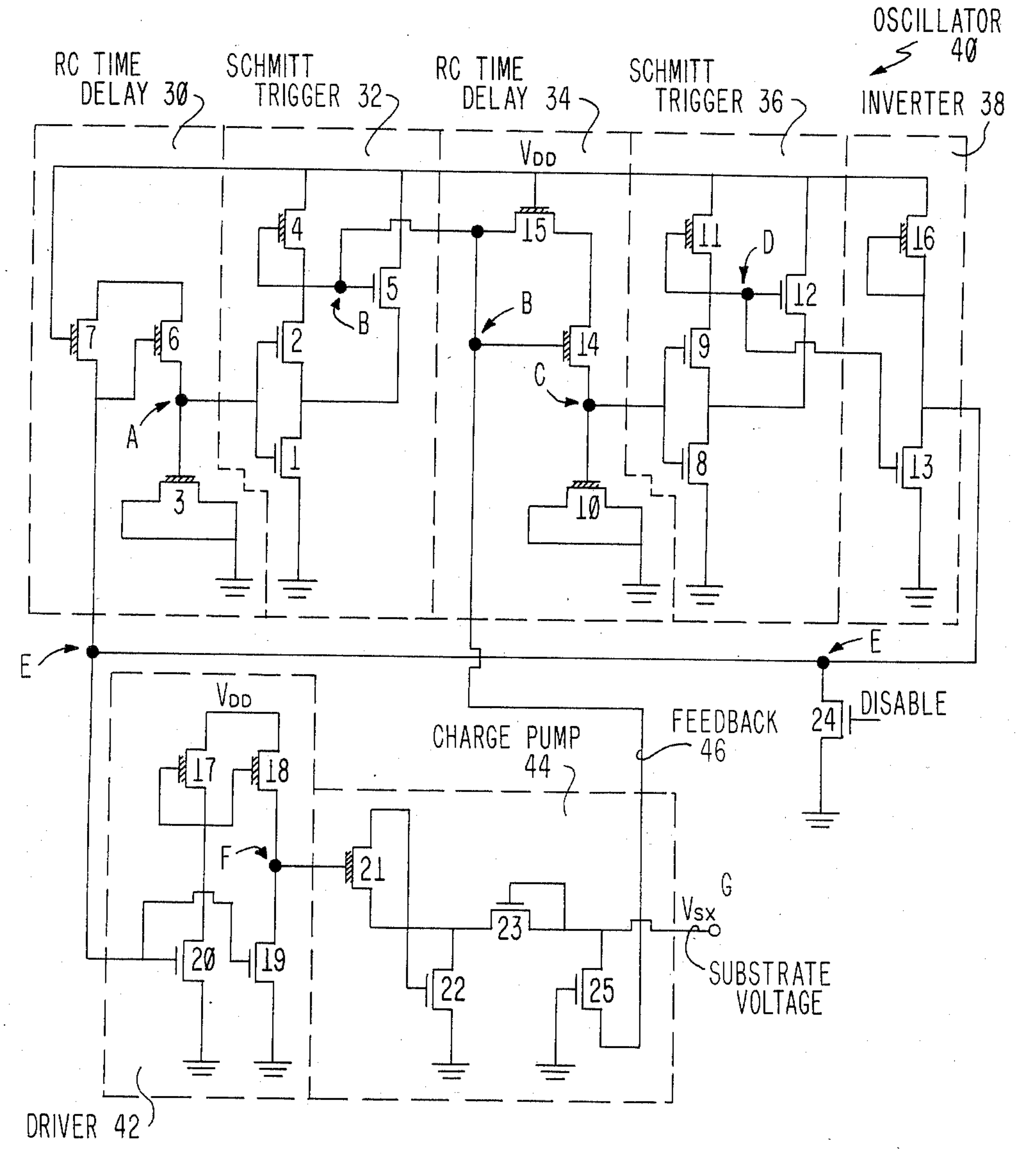
FIG. 1 is a circuit schematic diagram of the invention.

The substrate voltage generator circuit disclosed in FIG. 1 employs frequency modulation to modify the oscillator frequency of the substrate voltage generator, in order to more precisely control the resultant substrate voltage in a large scale integrated circuit. The circuit of FIG. 1 comprises two main parts, the oscillator 40 and the charge pump 44. The output node E of the oscillator 40 drives the charge pump 44 with a square wave whose frequency varies as a function of the feedback current flowing in the feedback circuit 46 from node B of the oscillator 40 to the charge pump 44. The higher the frequency of the oscillator 40, the greater will be the negative current input at node G to the substrate by the charge pump 44. As the charge pump 44 operates, the substrate voltage Vsx becomes more negative, which increases the feedback current in circuit 46, thereby slowing down the oscillator 40 until an equilibrium takes place.

Referring to FIG. 1, the oscillator circuit 40 consists of a first RC time delay circuit 30 including FET devices 6, 7 and the capacitor 3, which provides current to the input node A of a first Schmitt trigger circuit 32 comprising FET devices 1, 2, 4 and 5. The output of the first Schmitt trigger circuit 32 is input to node B of a second RC time delay circuit 34 comprising FET devices 14, 15 and the capacitor 10, whose output is applied to the input node C of a second Schmitt trigger circuit 36 comprising FET devices 8, 9, 11 and 12. The output of the second Schmitt trigger circuit at node D is passed through the inverter 38 comprising FET devices 13 and 16 so that there are three inverting stages connected in cascade, as represented by the first and second Schmitt trigger circuits 32 and 36 and the inverter 38. The output node E of the inventer 38 is connected back to the first RC time delay circuit 30 at device 7 so that an oscillator is formed by the first Schmitt trigger 32, the second Schmitt trigger 36 and inverter 38.

The output node E of the inverter circuit 38 is also connected through the push-pull driver circuit 42 comprising FET devices 17, 18, 19 and 20, to the coupling capacitor 21 of the charge pump 44. The charge pump 44 comprises the capacitor 21, and the FET devices 22 and 23. The substrate node G is connected through the FET device 25 to the feedback circuit 46.

When the oscillator 40 is running, negative going transitions output from the push-pull driver circuit 42 to the capacitor 21 will cause positive, conventional current to be drawn out of the substrate node G into the charge pump circuit 44.

The frequency modulated feedback mechanism which provides the precise control of the substrate voltage, includes the enhancement mode FET device 25 whose gate is connected to ground potential and whose source drain path is connected between the substrate node G and node B at the input to the second RC time delay circuit 34 of the oscillator 40.

As an example, the nominal substrate voltage Vsx to be achieved can be −1 volt at the node G. When the substrate voltage Vsx drops below −1 volt, the voltage divider effect provided by the load transistor 4 and the transistor 25 causes the voltage at node B to drop, thereby reducing the amount of charge applied to the plate of the capacitor 10 in the second RC time delay circuit 34. The longer time now required to charge up the plate at node C for the capacitor 10 will have the effect of reducing the frequency of oscillation of the oscillator circuit 40. Since the frequency of oscillation of the oscillator circuit 40 is reduced, the number of negative going transitions at the coupling capacitor 21 per unit time will also be reduced, thereby reducing the aggregate positive charge drawn out of the substrate at the node G into the charge pump 44. The substrate leakage current at the diffusions of the various circuits residing on the same integrated circuit chip as the substrate voltage generator, will have the effect of causing the substrate voltage Vsx to rise to an equilibrium at the nominal −1 volt level. As in all control circuits, the controlled voltage Vsx will pass through the nominal value and will become over corrected. In this example, if the substrate voltage Vsx then rises to a −0.5 volt value, the voltage divider effect of the load transistor 4 and the transistor 25 will cause the potential at node B to rise sufficiently so that additional charge will be applied to the plate at node C for the capacitor 10 in the second RC time delay circuit 34. This will have the effect of charging the capacitor 10 in a shorter period of time and thus causing the oscillator circuit 40 to oscillate at a higher frequency. The higher frequency oscillations are then applied to the plate of the coupling capacitor 21, and since each negative going transition at the capacitor 21 causes positive charge to be pulled out of the substrate at the node G and into the charge pump 44, the voltage Vsx of the substrate will be reduced and will pass downwardly to an equilibrium at the −1 volt value.

When the substrate voltage Vsx at the node G is at the nominal value of −1 volt, in this example, the current passing from node B through the FET device 25 will be drawn into the charge pump 44 along with the equilibrium substrate leakage current into node G from the integrated circuit chip itself. However, when the substrate voltage Vsx rapidly drops below the nominal −1 volt value, due to an abrupt change in substrate leakage currents originating elsewhere on the chip, the positive current flowing through the device 25 from the node B will have a portion of it flowing into the substrate at the node G to assist the leakage current on the chip in bringing the substrate voltage back up to the nominal −1 volt value. It is noted that the device 25 serves several functions, not only does it provide a feedback path for frequency modulated control of the oscillator 40, but it also provides an auxiliary source of positive current for increasing the responsiveness with which corrections to the substrate voltage Vsx can be made.

Figure 2:
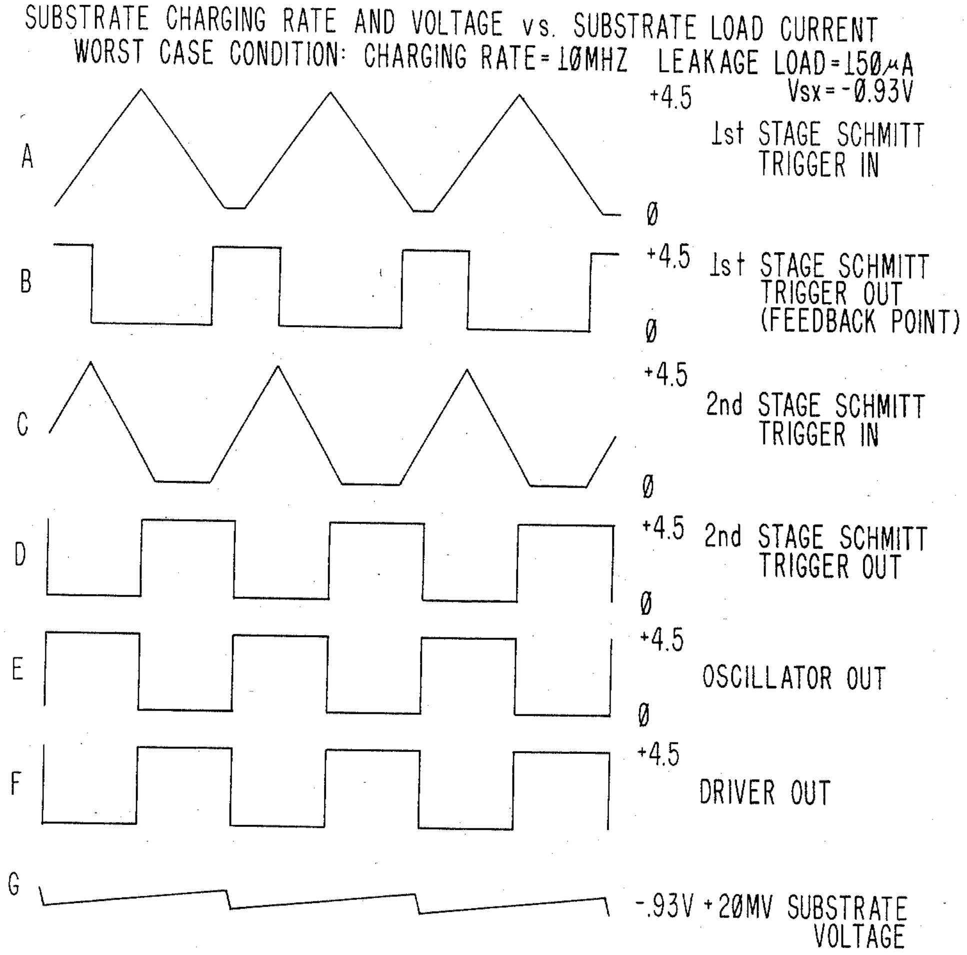
FIG. 2 is a series of waveform diagrams for nodes A through G of the circuit in FIG. 1, for a relatively large substrate load current.
Figure 3:
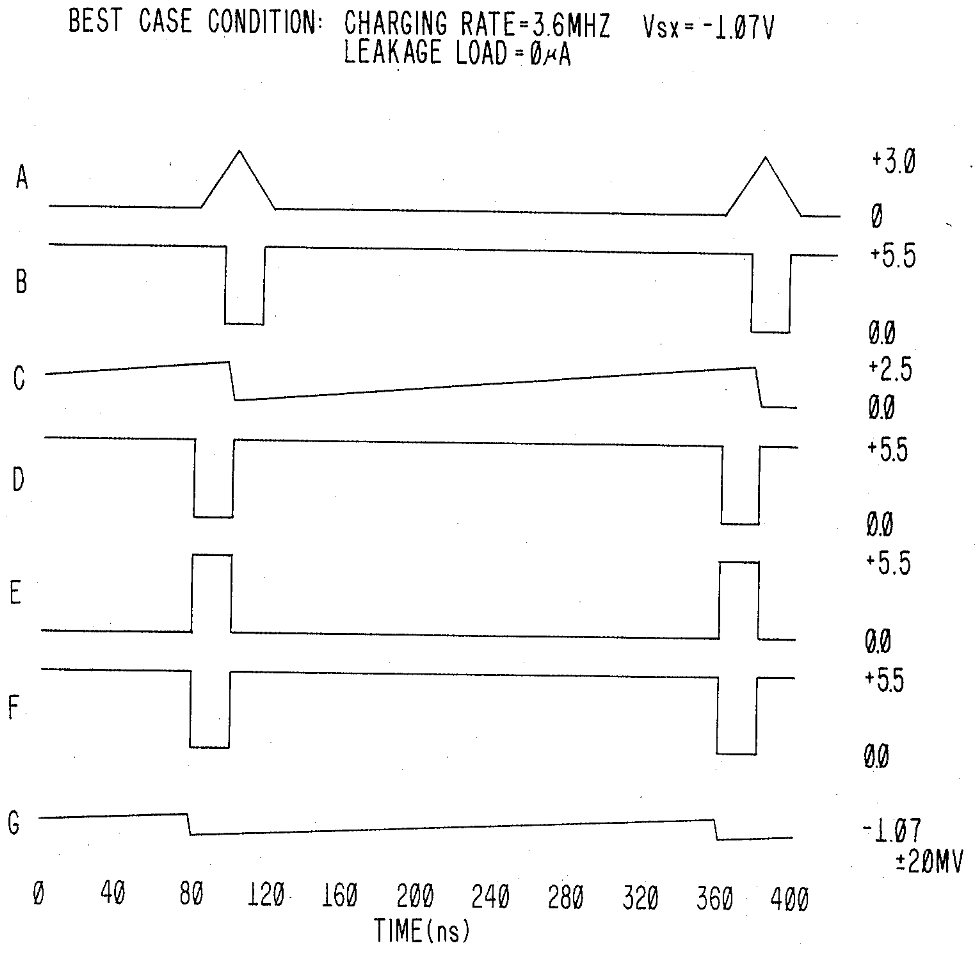
FIG. 3 is a series of waveform diagrams for nodes A through G of the circuit in FIG. 1, for a relatively small substrate load current.

As a further illustration of the operation of the circuit of FIG. 1, FIG. 2 shows the waveforms at the nodes A through G when the circuit is compensating for a relatively large leakage current. As an example, when the substrate leakage current is 150 microamperes, the oscillator 40 drives the charge pump 44 at a 10 megahertz rate. FIG. 3 shows the waveforms at nodes A through G when the circuit is compensating for a relatively small leakage current. As an example, when the substrate leakage current is 10 microamperes, the oscillator 40 drives the charge pump 44 at a 3.6 megahertz rate.

Figure 4:
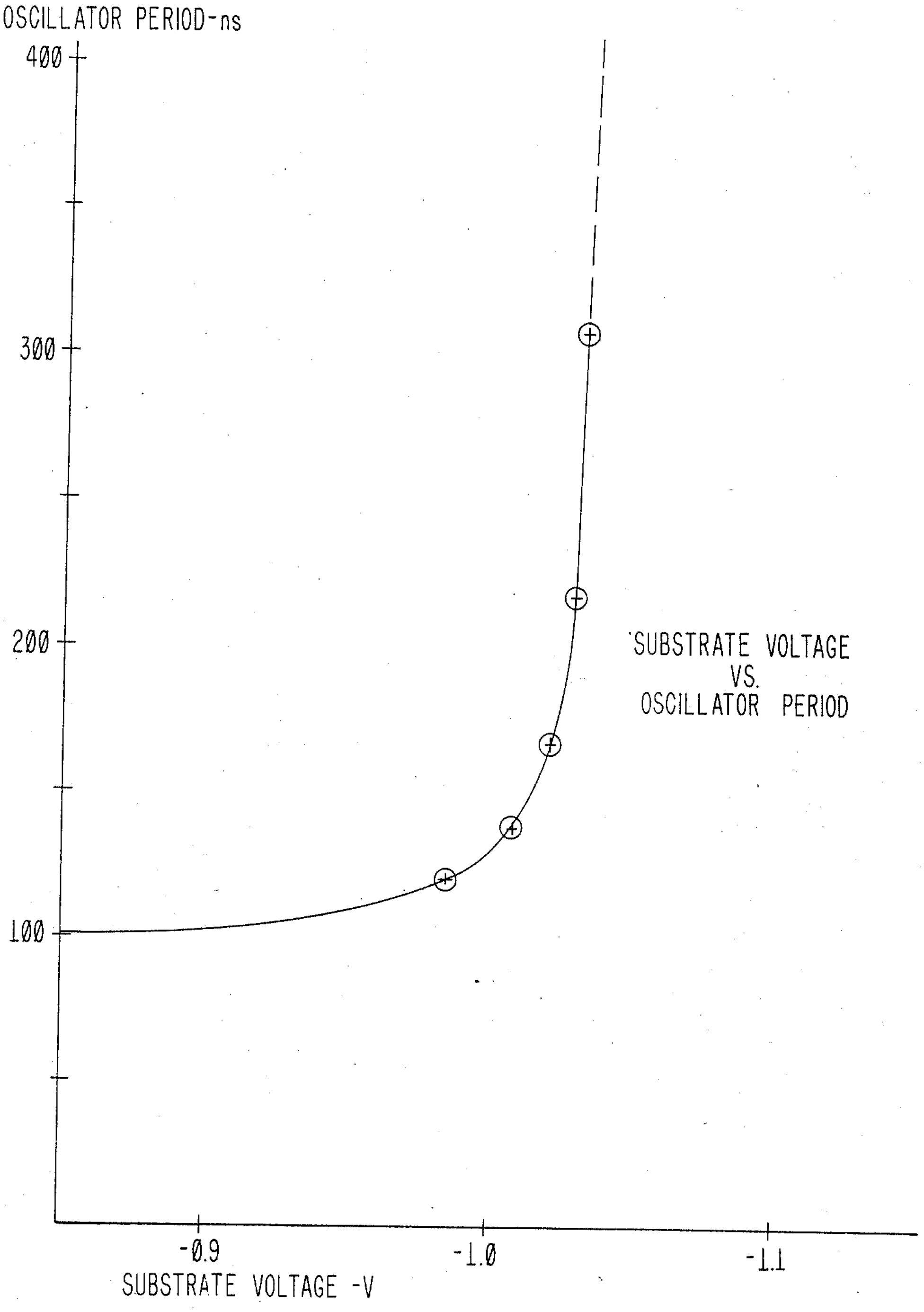
FIG. 4 is a graph of the oscillator period for the circuit of FIG. 1 versus the resultant substrate voltage.

As another illustration of the operation of the circuit of FIG. 1, the graph of FIG. 4 shows how the period of oscillation of the oscillator circuit 40 changes as the feedback circuit 46 senses a change in the substrate voltage Vsx due to operational changes elsewhere on the integrated circuit chip. When a change elsewhere on the chip causes the substrate voltage Vsx to become more negative, the period of the oscillator increases in response (the frequency decreases), thereby reducing the rate at which the charge pump 44 injects negative charge through node G into the substrate.

Figure 5:
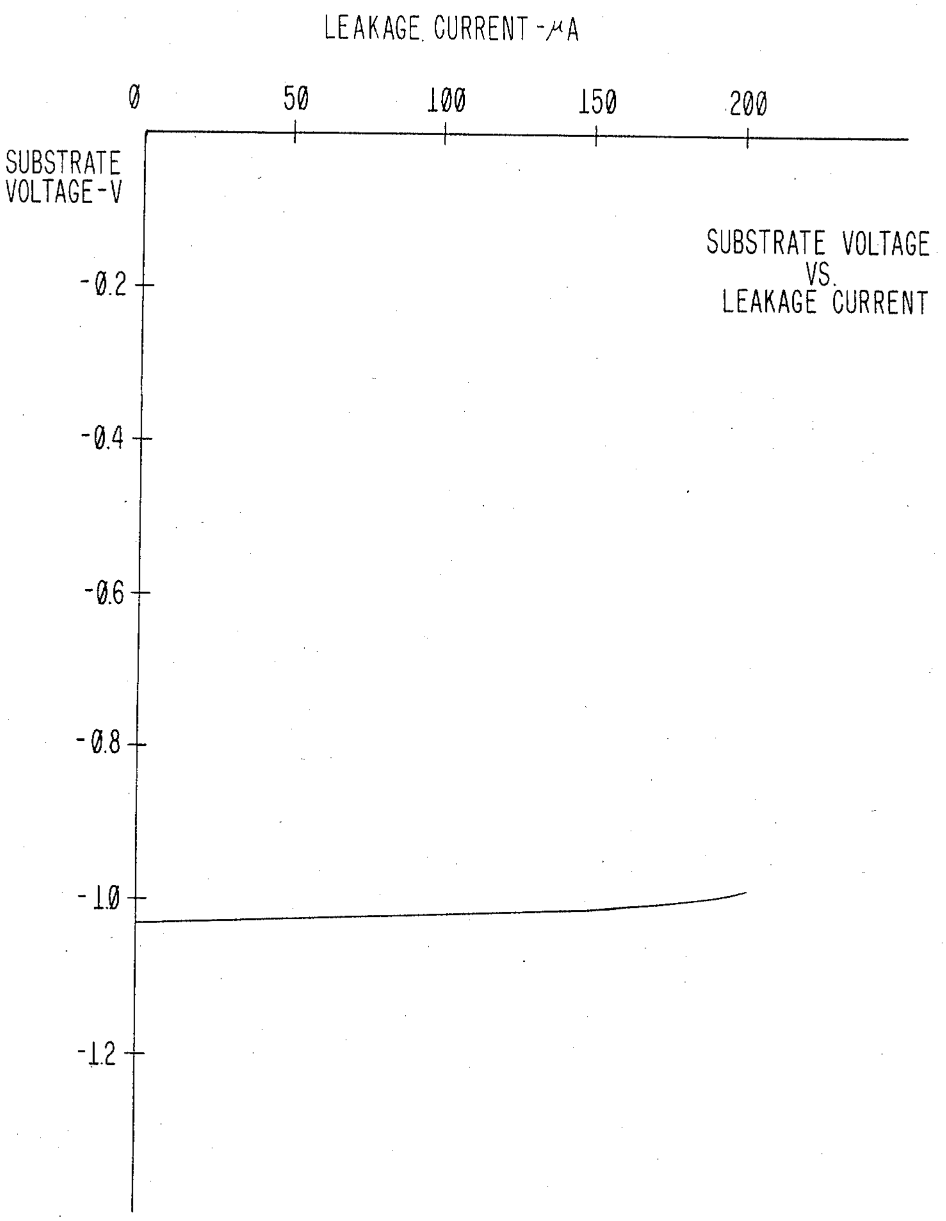
FIG. 5 is a graph of the resultant substrate voltage as a function of the substrate load current, showing the precise regulation provided by the circuit of FIG. 1.

The compound operation of the resulting circuit not only makes it responsive to rapid changes in substrate leakage current, but enables a very precise tolerance to be maintained on the resultant substrate voltage of the integrated circuit chip, as is illustrated by FIG. 5 in the graph of the resultant substrate voltage Vsx as a function of the substrate leakage current. FIG. 5 shows that the substrate voltage Vsx varies less than 5 percent over a substrate leakage current range of from zero to 150 microamperes. The resultant circuit provides a stable resultant substrate voltage at the relatively large leakage currents incurred in VLSI chips supporting more than 36,000 equivalent gates.

Although a specific embodiment of the invention has been disclosed it will be understood by those of skill in the art that the foregoing and other changes in form and detail may be made therein without departing from the spirit and the scope of the invention.

We claim:

1. A substrate voltage generator circuit for an integrated circuit, comprising:

a variable frequency oscillator circuit having a control input node and an output node, for providing oscillatory signals at said output node;

a charge pumping circuit having an input connected to said output node of said oscillator and an output node connected to said substrate, for providing a charging current to said substrate;

a first FET device having its gate connected to reference potential and its source drain path connected between said output node of said charging pumping circuit and said control input node of said oscillator, for providing a feedback signal to control the frequency of oscillation of said oscillator circuit in response to variations in the voltage of said substrate;

said frequency of oscillation increasing as said substrate voltage changes in a first direction, in order to pump more charge through said charge pumping circuit into said substrate, and said frequency decreasing in response to said substrate voltage going in the opposite direction in order for said charge pumping circuit to diminish the quantity of charge pumped into said substrate; whereby a precise control of the substrate voltage can be maintained.

2. A substrate voltage generator circuit for an integrated circuit, comprising:

an oscillator circuit including a first RC time delay circuit having an input node and an output node connected to the input of a first Schmitt trigger circuit whose output is connected to the input of a second RC time delay circuit whose output node is connected to the input of a second Schmitt trigger circuit whose output node is connected through an inverter stage to said input node of said first RC time delay circuit, for providing oscillatory signals at said inverter output node;

a charge pumping circuit having an input connected to said output node of said oscillator and an output node connected to said substrate, for providing a charging current to said substrate;

a first FET device having its gate connected to reference potential and its source drain path connected between said output node of said charging pumping circuit and said input node of said second RC time delay circuit in said oscillator, for providing a feedback signal to control the effective time delay of said second RC time delay circuit to thereby modify the frequency of oscillation of said oscillator circuit in response to variations in the voltage of said substrate;

said frequency of oscillation increasing as said substrate voltage changes in a first direction, in order to pump more charge through said charge pumping circuit into said substrate, and said frequency decreasing in response to said substrate voltage going in the opposite direction in order for said charge pumping circuit to diminish the quantity of charge pumped into said substrate;

whereby a precise control of the substrate voltage can be maintained.

3. The apparatus of claim 2, wherein said first FET device supplies an auxiliary current to said substrate in response to variations in said substrate voltage.

* * * * *